United States Patent
Huang et al.

(10) Patent No.: US 9,639,319 B2
(45) Date of Patent: May 2, 2017

(54) DISPLAY PANEL AND DISPLAY DEVICE

(71) Applicant: BOE TECHNOLOGY GROUP CO., LTD., Beijing (CN)

(72) Inventors: Guodong Huang, Beijing (CN); Seiji Fujino, Beijing (CN); Jiangbo Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 33 days.

(21) Appl. No.: 14/435,559

(22) PCT Filed: Aug. 22, 2014

(86) PCT No.: PCT/CN2014/085051
§ 371 (c)(1),
(2) Date: Apr. 14, 2015

(87) PCT Pub. No.: WO2015/139421
PCT Pub. Date: Sep. 24, 2015

(65) Prior Publication Data
US 2016/0179452 A1    Jun. 23, 2016

(30) Foreign Application Priority Data
Mar. 18, 2014 (CN) .......................... 2014 1 0100595

(51) Int. Cl.
*G06F 3/14* (2006.01)
*G02F 1/1335* (2006.01)
(Continued)

(52) U.S. Cl.
CPC ...... *G06F 3/1423* (2013.01); *G02F 1/133603* (2013.01); *G09G 3/3208* (2013.01);
(Continued)

(58) Field of Classification Search
None
See application file for complete search history.

(56) References Cited

U.S. PATENT DOCUMENTS

| 2004/0075628 A1 | 4/2004 | Chien et al. |
| 2005/0007517 A1 | 1/2005 | Anandan |
| 2007/0109465 A1* | 5/2007 | Jung ................. G02F 1/133603 349/71 |

FOREIGN PATENT DOCUMENTS

| CN | 1752800 A | 3/2006 |
| CN | 1787214 A | 6/2006 |

(Continued)

OTHER PUBLICATIONS

International Search Report and Written Opinion of the International Searching Authority with Notice of Transmittal of the International Search Report and Written Opinion of PCT/CN2014/085051 in Chinese, with English Translation mailed Dec. 23, 2014.

(Continued)

*Primary Examiner* — Kenneth B Lee, Jr.
(74) *Attorney, Agent, or Firm* — Collard & Roe, P.C.

(57) ABSTRACT

A display panel and a display device are provided. The display panel comprises a first substrate (1), a first liquid crystal display structure (2) and an organic electroluminescent structure (3); the first liquid crystal display structure (2) and the organic electroluminescent structure (3) are respectively provided at opposite sides of the first substrate (1), the organic electroluminescent structure (3) emits light from both sides; the light emitted from a side facing the first liquid crystal display structure (2) is used as the backlight for the first liquid crystal display structure (2), and the light emitted from a side facing away from the first liquid crystal display structure (2) can be used for displaying or illumination. The (Continued)

display panel is capable of double-sided display or illumination and has a reduced thickness.

16 Claims, 3 Drawing Sheets

(51) Int. Cl.
    *H01L 27/32*    (2006.01)
    *G09G 3/3208*  (2016.01)
    *G09G 3/36*     (2006.01)
    *G09G 3/34*     (2006.01)
    *G02F 1/1333*   (2006.01)

(52) U.S. Cl.
    CPC .............. *G09G 3/3413* (2013.01); *G09G 3/36* (2013.01); *G09G 3/3611* (2013.01); *H01L 27/3232* (2013.01); *H01L 27/3267* (2013.01); *G02F 2001/133342* (2013.01); *G02F 2201/44* (2013.01); *G09G 2360/04* (2013.01); *H01L 2251/5323* (2013.01)

(56) References Cited

FOREIGN PATENT DOCUMENTS

| | | |
|---|---|---|
| CN | 1815748 A | 8/2006 |
| CN | 1967343 A | 5/2007 |
| CN | 201429935 Y | 3/2010 |
| CN | 101707028 A | 5/2010 |
| CN | 103915481 A | 7/2014 |
| CN | 203746370 U | 7/2014 |

OTHER PUBLICATIONS

Chinese Office Action in Chinese Application No. 201410100595.8 mailed Dec. 30, 2015 with English translation.
Second Chinese Office Action in Chinese Application No. 201410100595.8 mailed Aug. 17, 2016 with English translation.
Third Chinese Office Action in Chinese Application No. 201410100595.8 mailed Nov. 28, 2016 with English translation.

* cited by examiner

DISPLAY PANEL AND DISPLAY DEVICE

CROSS REFERENCE TO RELATED APPLICATIONS

This application is the National Stage of PCT/CN2014/085051 filed on Aug. 22, 2014, which claims priority under 35 U.S.C. §119 of Chinese Application No. 201410100595.8 filed on Mar. 18, 2014, the disclosure of which is incorporated by reference.

TECHNICAL FIELD

At least one embodiment of the present invention relates to a display panel and a display device.

BACKGROUND

Figure 1:
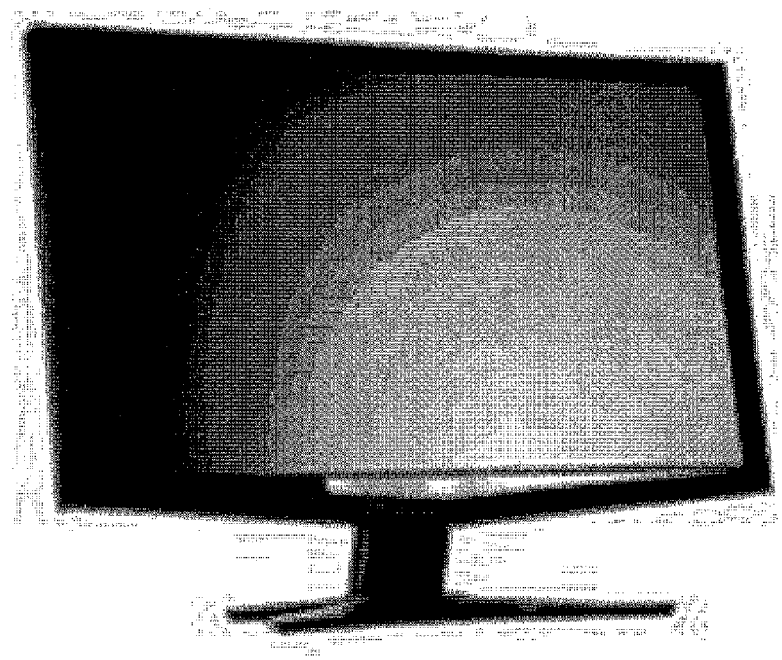

In a display device, as shown in FIG. 1, generally there is provided only one display screen. This kind of display device can only realize a single-sided display and thus more and more cannot meet the requirement of the service businesses such as communication, government agencies, banking, traffic management, and so on.

Figure 2:
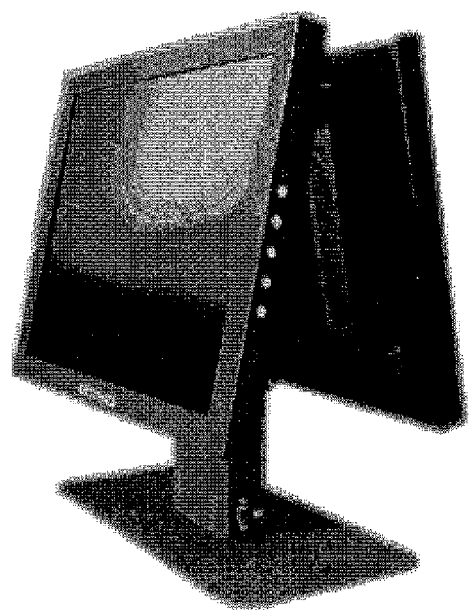

In order to accommodate the development of the above industries, a display device capable of achieving double-sided display or illumination has been developed. As shown in FIG. 2, this kind of display device can achieve double-sided display.

SUMMARY

At least one embodiment of the present invention provides a display panel and a display device for simplifying the structure of the display device capable of achieving double-sided display.

At least one embodiment of the present invention provides a display panel comprising a first substrate; a first liquid crystal display structure and an organic electroluminescent structure. The first liquid crystal display structure and the organic electroluminescent structure are respectively provided at both sides of the first substrate. The organic electroluminescent structure can emit light from both sides, and the light emitted from a side of the organic electroluminescent structure facing the first liquid crystal display structure is used as the backlight for the first liquid crystal display structure, and the light emitted from a side facing away from the first liquid crystal display structure is used to illuminate or display.

At least one embodiment of the present invention also provides a display device including the above display panel.

DESCRIPTION OF THE ATTACHED DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a diagram of a display device;
FIG. 2 is a diagram of another display device; and
FIG. 3a to FIG. 3f are schematic diagram showing the structure of a display panel provided by the embodiments of the present invention, respectively.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The size and thickness of layers or films in the accompanying drawings do not reflect true scales, and are only used to illustrate the disclosure of the present invention.

The inventors of the present application noticed that the display device shown in FIG. 2 has two display screens, and thus has a bulky volume and a relatively large thickness and does not comply with the development tendency of light weight and slim, miniature profile in the display field. Therefore, it is desired by the person skilled in the art to provide a simplified structure of the display device for achieving double-sided display or illumination.

At least one embodiment of the present invention provides a display panel, as shown in FIG. 3a to FIG. 3e, the display panel includes a first substrate 1, and a first liquid crystal display structure 2 and an organic electroluminescent structure 3, and the first liquid crystal display structure 2 and the organic electroluminescent structure 3 are respectively provided at the opposite sides of the first substrate 1. The organic electroluminescent structure 3 can emit light from its both sides, and the light emitted from the side facing the first liquid crystal display structure 2 is used as the backlight for the first liquid crystal display structure 2, and the light emitted from the other side facing away from the first liquid crystal display structure 2 is used to illuminate or display. In one embodiment, the first liquid crystal display structure 2 and the organic electroluminescent structure 3 can share the first substrate 1 as a base substrate. Of course, the first display structure 2 and the organic electroluminescent structure 3 may not share one base substrate, and for example, their respective base substrates are attached together by adhesive.

In the above display panel provided by at least one embodiment of the present invention, since the first liquid crystal display structure 2 and the organic electroluminescent structure 3 are respectively provided at the opposite sides of the first substrate 1, the thickness of the panel can be reduced. Furthermore, the organic electroluminescent structure 3 emits light from both sides, the light emitted from the side facing the first liquid crystal display structure 2 is used as the backlight for the first liquid crystal display structure 2 so that the first liquid crystal display structure can be used to display or illuminate, and the light emitted from the other side facing away from the first liquid crystal display structure 3 is used to illuminate or display; in this way, not only double-sided display or illumination can be achieved, but also the backlight provided specially for the first liquid crystal display structure 2 can be omitted, thus the thickness of the display panel can be further reduced.

Figure 3A:
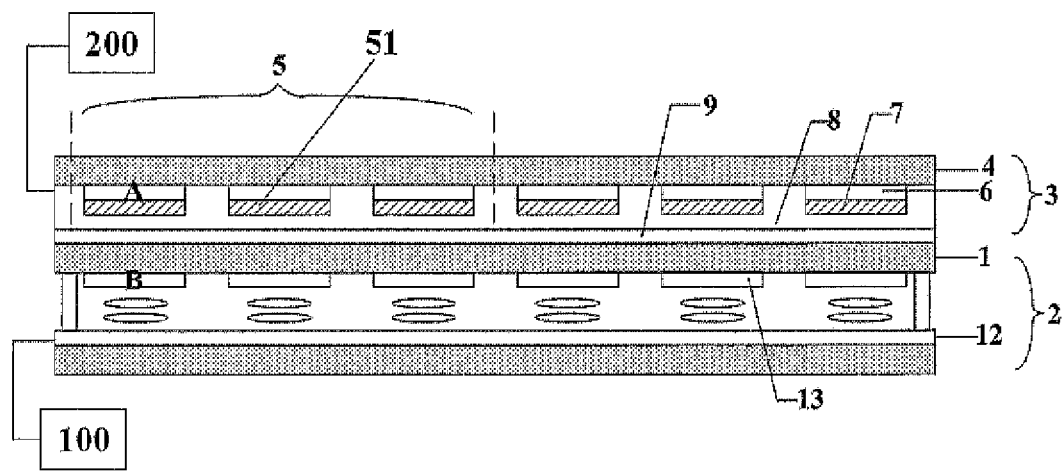
Figure 3B:
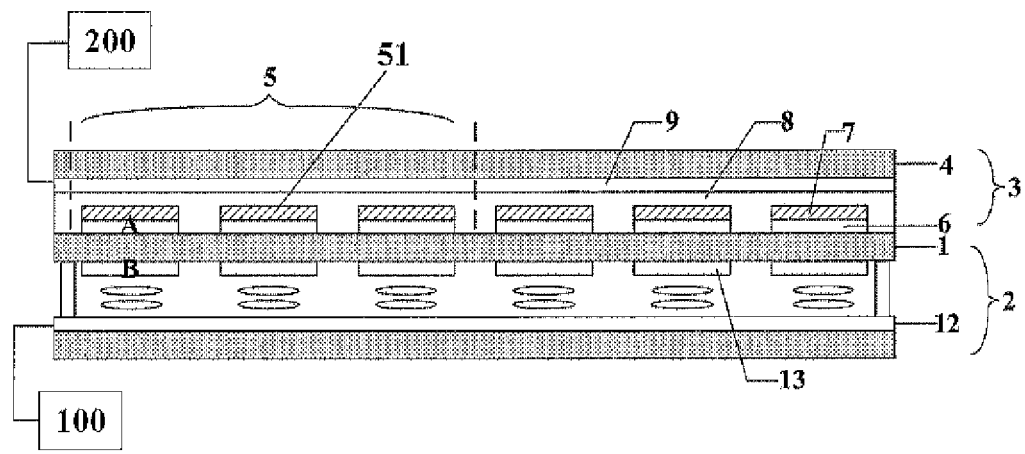

In the display panel provided by an embodiment of the present invention, as shown in FIG. 3a and FIG. 3b, the organic electroluminescent structure 3, for example, includes a second substrate 4, and a plurality of light emitting unit 5 arranged in a matrix and pixel circuits for controlling the respective light emitting unit 5 to emit light, which are located between the first substrate 1 and the second substrate 4. Each of the light emitting unit 5 may include a first transparent electrode 6, a light emitting layer 7 and a second transparent layer 8 which are laminated in this order. For example, the first transparent electrode 6 may be a cathode, and the second transparent electrode 8 may be an anode, but there is no limitation thereto. FIG. 3a and FIG. 3b are described by way of example that the first transparent electrode 6 is an anode (generally arranged in a matrix) and the second transparent electrode 8 is a cathode (generally arranged in a whole surface). Of course, the organic electroluminescent structure 3 is also suitable for the example that the first liquid crystal display structure 2 and the organic electroluminescent structure 3 do not share the base substrate.

In one embodiment, during the above-described display panel provided by the embodiment of the present invention is manufactured, as shown in FIG. 3a, the pixel circuits, the first transparent electrode 6, the light emitting layer 7, the second transparent electrode 8 and a film package layer 9 are subsequently formed on the second substrate 4, and after that, the second substrate 4 is inverted by 180 degree, and then is attached with the first substrate 1. Alternatively, in one embodiment, as shown in FIG. 3b, it is also possible to subsequently form the pixel circuits, the first transparent electrode 6, the light emitting layer 7, the second transparent electrode 8 and a film package layer 9 on the first substrate 1, and then attach the second substrate 4. There is no limitation thereto.

In the display panel provided by the embodiments of the present invention, as shown in FIG. 3a and FIG. 3b, when the pixel circuits are in on-state to control the respective light emitting units 5 to emit light, the light emitted from the side of the organic electroluminescent structure 3 facing away from the first liquid crystal display structure 2 can be used to display or illuminate. Furthermore, the light emitted from the side of the organic electroluminescent structure 3 facing the first liquid crystal display structure 2 is used as the backlight for the first liquid crystal display structure so that the first liquid crystal display structure 2 can be used to display or illuminate. Therefore, the display panel shown in FIG. 3a and FIG. 3b can be used to double-sided display or illuminate.

For example, the particular structure and embodiments of the pixel circuits for controlling the light emitting unit 5 can be achieved by the technology known by the person skilled in the art, and will not further described herein.

In one embodiment, each of the light emitting units 5 may include three light emitting sub-units 51, and these three light emitting sub-units 51 respectively emit light in three primary colors (Red, Green and Blue). FIG. 3a and FIG. 3b are described by taking two light emitting units 5 as example. Of course, each of the light emitting units 5 may further include a light emitting sub-unit 51 emitting light in other kind of color, and there is no limitation.

In order to increase the brightness of the organic electroluminescent structure 3, in the display panel provided by one embodiment of the present invention, the light emitting unit 5 each includes a light emitting sub-unit 51 for emitting white light. For example, each of the light miffing units 5 may have four light emitting sub-units 51, and these four light emitting sub-units 51 respectively emit light in four colors, i.e., Red, Green, Blue and White.

The display panel provided by one embodiment of the present invention may further include a first driving circuit 100 for driving the first liquid crystal display structure 2 and a second driving circuit 200 for driving the organic electroluminescent structure 3. When the above-described display panel provided by the embodiment of the present invention is used to double sided display, the first liquid crystal display structure 2 and the organic electroluminescent structure 3 are driven by the first driving circuit 100 and the second driving circuit 200, respectively, to display the same image information, that is, at the same time, the two sides of the display device (i.e., the first liquid crystal display structure 2 side and the organic electroluminescent structure 3 side) display the same image information. For example, when it is operated in the service branches of the communication industries, government agencies, banking business, traffic management, and so on, the staff and the customer can simultaneously watch the same information by the display device capable of double-sided display. Alternatively, the first liquid crystal display structure 2 and the organic electroluminescent structure 3 may be respectively driven by the first driving circuit 100 and the second driving circuit 200 to display different image information, that is, at the same time, the two sides of the display device (i.e., the first liquid crystal display structure 2 side and the organic electroluminescent structure 3 side) display different image information. For example, when used at home, the television capable of double-sided display may facilitate two persons to watch different TV programs at the same time.

It should be noted that when implementing the above display panel as provided by the embodiments of the present invention, since the light emitted from the side of the organic electroluminescent structure 2 facing the first liquid crystal display structure 2 is used as the backlight for the first liquid crystal display structure 2, thus, when the first driving circuit 100 drives the first liquid crystal display structure 2 to display or illuminate, the second driving circuit 200 is in on-state; while when the second driving circuit 200 drives the organic electroluminescent structure 3 to display or illustrate, it is not restricted by the operation state of the first driving circuit 100, that is, whatever the first driving circuit 100 is in on- or off-state, the organic electroluminescent structure 3 can be used to display or illuminate. It should be noted that the drawings only schematically show the connection relationship between the first driving circuit 100 and the first liquid crystal display structure 2 and between the second driving circuit 200 and the organic electroluminescent structure 3, the embodiments of the present invention will not be limited thereto.

Figure 3C:
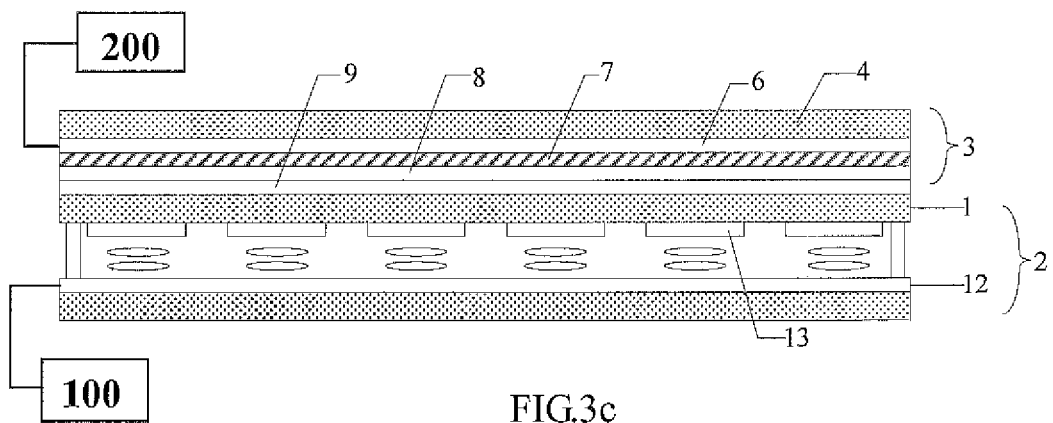
Figure 3D:
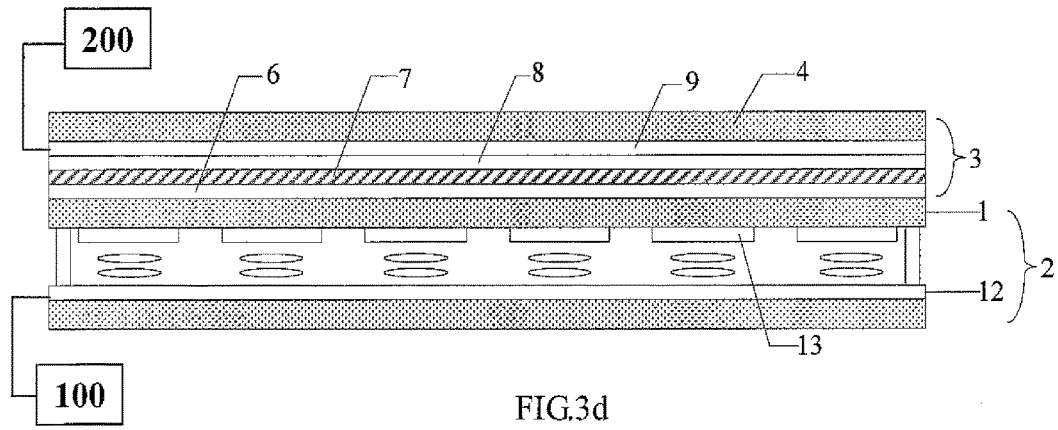

When implementing the above display panel provided by the embodiments of the present invention, as shown in FIG. 3c and FIG. 3d, the light emitted from the side of the organic electroluminescent structure 3 facing away from the first liquid crystal display structure 2 is also used for illumination. For example, the organic electroluminescent structure 3 may include a second substrate 4, and a first transparent electrode 6, a light emitting layer 7 and a second transparent electrode 8, which are located between the second substrate 4 and the first substrate 1, laminated one upon the other, and arranged in a whole surface. The first transparent electrode 6 may be a cathode, while the second transparent electrode 8 may be an anode; or the first transparent electrode may be an anode while the second transparent electrode 8 may be a cathode, there is no limitation thereto.

Compared with the display panel shown in FIG. 3a and FIG. 3b in which the first transparent electrodes 6 and the light emitting layer 7 are arranged in a matrix, in the display panel shown in FIG. 3c and FIG. 3d as provided by the embodiment of the present invention, the first transparent electrode 6, the light emitting layer 7 and the second transparent electrode 8 are all provided in a whole surface, and the pixel circuits for controlling the emitting of the light emitting units 5 is omitted, thus the side of the organic electroluminescent structure 3 facing away from the first substrate 1 can emit light from the whole surface, and the light emitted from the side of the organic electroluminescent structure 3 facing away from the first substrate 1 can only be used for illumination. Of course, the organic electroluminescent structure 3 provided by the embodiment of the present invention is further suitable for the example in which the first liquid crystal display structure 2 and the organic electroluminescent structure 3 do not share a base substrate.

In one embodiment, during manufacturing of the above display panel provided by the embodiment of the present invention, as shown in FIG. 3c, after the first transparent electrode 6, the light emitting layer 7, the second transparent electrode 8 and a film package layer 9 are subsequently laminated on the second substrate 4 and is formed in a whole surface, the second substrate 4 is inverted by 180 degree to be attached with the first substrate 1. Alternatively, in one embodiment, as shown in FIG. 3d, the first transparent electrode 6, the light emitting layer 7, the second transparent electrode 8 and the film package layer 9 are directly laminated on the first substrate 1 in sequence and are formed in a whole surface, and then resultant structure is attached with the second substrate 4. There is no limitation thereon.

Figure 3E:
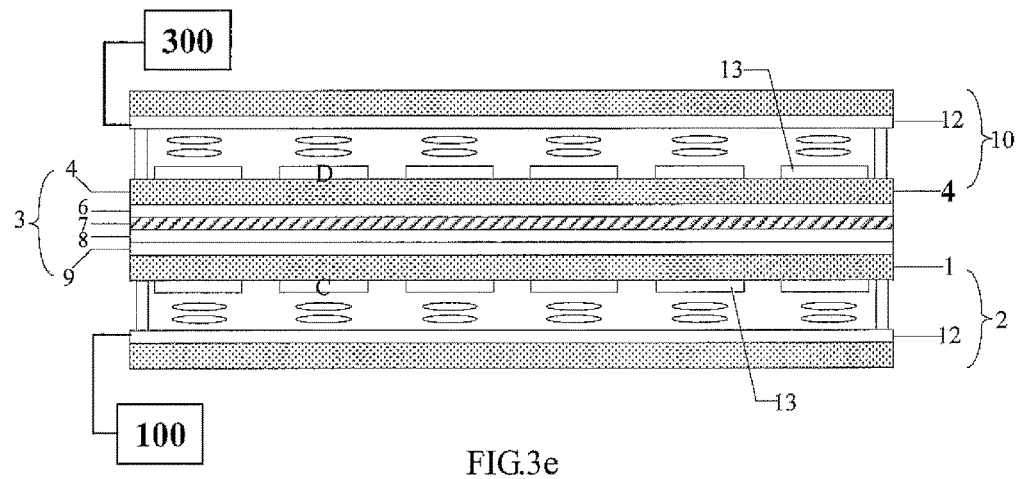
Figure 3F:
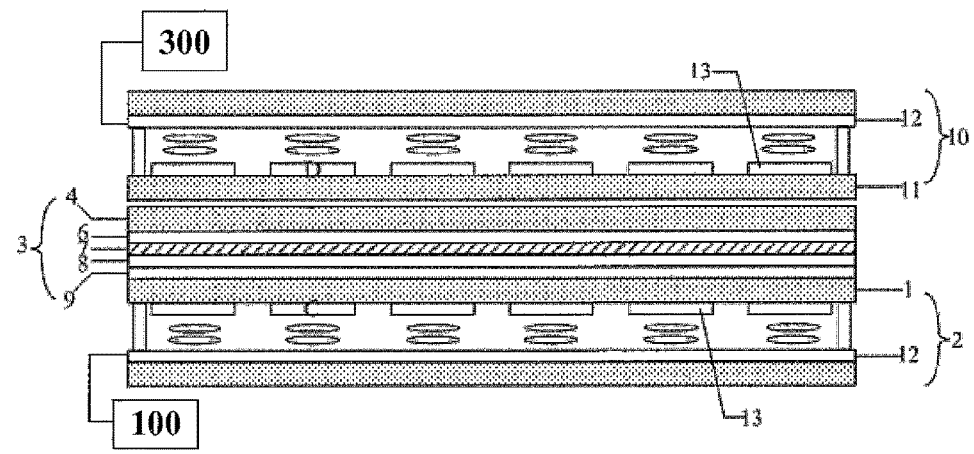

The display panel provided by an embodiment of the present invention, as shown in FIG. 3e, may further include a second liquid crystal display structure 10 provided on the side of the organic electroluminescent structure 3 facing away from the first substrate 1. In one embodiment, the second liquid crystal display structure 10 and the organic electroluminescent structure 3 can share a base substrate, that is, share the second substrate 4 as the base substrate, as shown in FIG. 3e; in this way, the thickness of the display panel can be reduced. In one embodiment, the display panel further includes a third substrate 11 located between the second liquid crystal display structure 10 and the organic electroluminescent structure 3. The third substrate 11 may be adhered with the second substrate 4 included in the organic electroluminescent structure 3 by adhesive, as shown in FIG. 3f. The light emitted from a side of the organic electroluminescent structure 3 facing the second liquid crystal display structure 10 can be used as the backlight for the second liquid crystal display structure 10, and the light emitted from a side of the organic electroluminescent structure 3 facing the first liquid crystal display structure 2 can be used as the backlight for the first liquid crystal display structure 2, thus double-sided display or illumination can be achieved. Moreover, the organic electroluminescent structure 3 emitting light from its both sides is used as the backlight for both the first liquid crystal display structure 2 and the second liquid crystal display structure 10, one independent backlight can be omitted, and the thickness of the display panel can be further reduced.

For example, the organic electroluminescent structure 3 in FIG. 3e and FIG. 3f has the structure as shown in FIG. 3a and FIG. 3b, includes pixel circuits for controlling the light emitting units 5 to emit light, first transparent electrodes and light emitting layers 7 arranged in a matrix, and a second transparent electrode 8 provided in a whole surface; alternatively, it may have the structure as shown in FIG. 3c and FIG. 3d, include a first transparent electrode 6, a light emitting layer 7 and a second transparent electrode 8 provided in a whole surface. There is no limitation. The organic electroluminescent structure 3 in FIG. 3e will be described by way of the example that the first transparent electrode 6, the light emitting layer 7 and the second transparent electrode 8 provided in a whole surface are included.

For example, in the above-described display panel provided by the embodiment of the present invention, as shown in FIG. 3a to FIG. 3e, the first liquid crystal display structure 2 for example may be of twisted nematic (TN) type, that is, a common electrode 12 and a pixel electrode 13 are provided on two substrates, respectively; or it may be of advanced ultra-dimensional field switching (ADS) type or in-plane switching (IPS) type, that is, the common electrode and the pixel electrode are both provided on the same one substrate. There is no limitation thereto. Similarly, as shown in FIG. 3e, the second liquid crystal display structure 10 may be of twisted nematic (TN) type, that is, a common electrode 12 and a pixel electrode 13 are provided on two substrates, respectively; or may also be of advanced ultra-dimensional field switching (ADS) type or in-plane switching (IPS) type, that is, the common electrode and the pixel electrode are both provided on the same one substrate. There is no limitation thereto.

For example, the specific structure and implementation of the first liquid crystal display structure 2 and the second liquid crystal display structure 10 can use the technology well-known to the person skilled in the art, and will not further described herein.

The display panel provided by an embodiment of the present invention may further include a first driving circuit 100 for driving the first liquid crystal display structure 2 to display and a third driving circuit 300 for driving the second liquid crystal display structure 10. When the above display panel provided by the embodiment of the present invention is used to conduct double-sided display, the first liquid crystal display structure 2 and the second liquid crystal display structure 10 are respectively driven by the first driving circuit 100 and the third driving circuit 300 to display same image information, that is, at the same time, both sides of the display device (that is, the first liquid crystal display structure 2 side and the second liquid crystal display structure 10 side) display the same image information. For example, when it is operated in the service branches of the communication, government agencies, banking business, traffic management, and so on, the staff and the customer can simultaneously watch the same information by the display device capable of double-sided display. Alternatively, the first liquid crystal display structure 2 and the second liquid crystal display structure 10 are respectively driven by the first driving circuit 100 and the third driving circuit 300 to display different image information, that is, at the same time, both sides of the display device (that is, the first liquid crystal display structure 2 side and the second liquid crystal display structure 10 side) display different image information. For example, when the television capable of double-sided display is used at home, two persons may watch different TV programs at the same time. It should be noted that the drawings only schematically show the connection relationship between the first driving circuit 100 and the first liquid crystal display structure 2 and between the third driving circuit 300 and the second liquid crystal display structure 10, the embodiments of the present invention will not be limited thereto.

It should be noted that, in implementing the display panel shown in FIG. 3e as provided by the embodiment of the present invention, the light emitted from a side of the organic electroluminescent structure 3 facing the first liquid crystal display structure 2 can be used as the backlight for the first liquid crystal display structure 2, and the light emitted from a side of the organic electroluminescent structure 3 facing the second liquid crystal display structure 10 can be used as the backlight for the second liquid crystal display structure 10, thus, when the first liquid crystal display structure 2 and/or the second liquid crystal display structure 10 are used to display or illuminate, the second driving circuit 200 is in on-state.

Furthermore, there is no interference between the operation state of the first driving circuit 100 and the operation state of the third driving circuit 300. For example, when the first driving circuit 100 is in on-state and the third driving circuit 300 is in off-state, only the first liquid crystal display structure 2 side is used for display or illumination; or when the first driving circuit 100 is in off-state and the third driving circuit 300 is in on-state, only the second liquid crystal display structure 10 side is used for display or illumination; or when the first driving circuit 100 and the third driving circuit 300 both are in on-state, the first liquid crystal display structure 2 and the second liquid crystal display structure 10 both are used for display or illumination, and double-sided display or illumination can be achieved.

Furthermore, in the case that the display panel shown in FIG. 3a and FIG. 3b is used for double-sided display, when a certain pixel electrode 13 in the organic electroluminescent structure 3 (pixel electrode A as shown in FIG. 3a and FIG. 3b) is in off-state, and the corresponding pixel electrode 13 in the first liquid crystal display structure 2 (pixel electrode B as shown in FIG. 3a and FIG. 3b) is also in off-state, the pixel electrode A in the organic electroluminescent structure 3 and the pixel electrode B in the first liquid crystal display structure 2 will not influence brightness of each other, by which the contrast of the display panel can be improved.

In the case that the display panel shown in FIG. 3e is used for double-sided displaying, when a certain pixel electrode 13 (pixel electrode C in FIG. 3e) in the first liquid crystal display structure 2 is in off-state and a corresponding pixel electrode 13 (pixel electrode D in FIG. 3e) in the second liquid crystal display structure 10 is also in off-state, the pixel electrode C in the first liquid crystal display structure 2 and the pixel electrode D in the second liquid crystal display structure 10 will not influence brightness of each other, by which the contrast of the display panel can be improved.

Based on the same inventive concept, at least one embodiment of the present invention further provides a display device comprising the above display panel provided by the embodiments of the present invention. The display device can be any product or component having display function, such as a mobile phone, a tablet computer, a television, a monitor, a laptop computer, a digital photo frame, a navigator, and so on. The display device can be implemented by referring to the above embodiments of the display panel, and will not be further described herein.

At least one embodiment of the present invention provides a display panel and a display device, the display panel includes a first substrate, a first liquid crystal display structure and an organic electroluminescent structure. Since the first liquid crystal display structure and the organic electroluminescent structure are respectively provided at the opposite sides of the first substrate and furthermore the organic electroluminescent structure can emit light from both sides, the light emitted from a side of the organic electroluminescent structure facing the first liquid crystal display structure can be used as the backlight of the first liquid crystal display structure so that the first liquid crystal display structure can be used for display or illumination, and the light emitted from a side of the organic electroluminescent structure facing away from the first liquid crystal display structure can be used for display or illumination, not only the double-sided display or illumination can be achieved, but also the backlight source separately provided for the first liquid crystal display structure can be omitted, thus the thickness of the display panel can be further reduced.

It is apparent to the person skilled in the art that various modification and variation can be made to the present invention without departing from the spirit and scope of the present invention. Thus, it is intended to include these modification and variation in the present invention if these modification and variation falls within the scope defined by the claims and its equivalents.

The present application claims the priority of Chinese Patent Application No. 201410100595.8 filed on Mar. 18, 2014, the Chinese Patent Application is entirely incorporated herein by reference as a part of the present application.

What is claimed is:

1. A display panel comprising a first substrate, a first liquid crystal display structure and an organic electroluminescent structure, a first driving circuit configured for driving the first liquid crystal display structure to display and a second driving circuit configured for driving the organic electroluminescent structure to display;
   wherein the first liquid crystal display structure and the organic electroluminescent structure are respectively provided at opposite sides of the first substrate;
   wherein the organic electroluminescent structure is configured to emit light from both sides, light emitted from a side facing the first liquid crystal display structure is used as a backlight for the first liquid crystal display structure, and light emitted from a side facing away from the first liquid crystal display structure is used for displaying or illumination; and
   wherein the first liquid crystal display structure and the organic electroluminescent structure are respectively driven by the first driving circuit and the second driving circuit to display same or different image information.

2. The display panel as claimed in claim 1, wherein the first liquid crystal display structure and the organic electroluminescent structure share the first substrate as a base substrate.

3. The display panel as claimed in claim 1, wherein the organic electroluminescent structure includes:
   a second substrate, and
   a plurality of light emitting units located between the first substrate and the second substrate and arranged in a matrix.

4. The display panel as claimed in claim 3, wherein each of the light emitting units includes a light emitting sub-unit emitting white light.

5. The display panel as claimed in claim 1, wherein the organic electroluminescent structure includes:
   a second substrate, and a first transparent electrode, a light emitting layer and a second electrode located between the first substrate and the second substrate, laminated in order and arranged as a whole surface.

6. The display panel as claimed in claim 1, further comprising a second liquid crystal display structure located at a side of the organic electroluminescent structure facing away from the first substrate,
   Wherein light emitting from a side of the organic electroluminescent structure facing the second liquid crystal display structure is used as a backlight for the second liquid crystal display structure.

7. The display panel as claimed in claim 6, further comprising a third substrate located between the second liquid crystal display structure and the organic electroluminescent structure.

8. The display panel as claimed in claim 6, wherein the second liquid crystal display structure and the organic electroluminescent structure share the base substrate.

9. The display panel as claimed in claim 6, wherein the first liquid crystal display structure is of advanced ultra-dimension filed switching type, twisted nematic type or in-plane switching type;
the second liquid crystal display structure is of advanced ultra-dimension filed switching type, twisted nematic type or in-plane switching type.

10. A display device comprising the display panel as claimed in claim 1.

11. The display panel as claimed in claim 2, wherein the organic electroluminescent structure includes:
a second substrate, and
a plurality of light emitting units located between the first substrate and the second substrate and arranged in a matrix.

12. The display panel as claimed in claim 11, wherein each of the light emitting units includes a light emitting sub-unit emitting white light.

13. The display panel as claimed in claim 3, further comprising a second liquid crystal display structure located at a side of the organic electroluminescent structure facing away from the first substrate,
wherein light emitting from a side of the organic electroluminescent structure facing the second liquid crystal display structure is used as a backlight for the second liquid crystal display structure.

14. The display panel as claimed in claim 13, further comprising a third substrate located between the second liquid crystal display structure and the organic electroluminescent structure.

15. The display panel as claimed in claim 13, wherein the second liquid crystal display structure and the organic electroluminescent structure share the base substrate.

16. The display panel as claimed in claim 13, wherein the first liquid crystal display structure is of advanced ultra-dimension filed switching type, twisted nematic type or in-plane switching type;
the second liquid crystal display structure is of advanced ultra-dimension filed switching type, twisted nematic type or in-plane switching type.

\* \* \* \* \*